United States Patent
Kunii et al.

(10) Patent No.: US 7,389,056 B2
(45) Date of Patent: Jun. 17, 2008

(54) PREAMPLIFIER CIRCUIT, CLOCK SWITCHING CIRCUIT, AND OPTICAL RECEIVER

(75) Inventors: Masaki Kunii, Yokohama (JP); Hirokazu Osada, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 178 days.

(21) Appl. No.: 11/043,078

(22) Filed: Jan. 27, 2005

(65) Prior Publication Data
US 2005/0128007 A1  Jun. 16, 2005

Related U.S. Application Data

(63) Continuation of application No. PCT/JP2004/000647, filed on Jan. 26, 2004.

(30) Foreign Application Priority Data
Jan. 27, 2003  (JP) .................. PCT/JP03/00734

(51) Int. Cl.
H04B 10/06 (2006.01)
H03F 3/08 (2006.01)
H04L 27/08 (2006.01)

(52) U.S. Cl. .................. 398/209; 398/208; 330/308; 375/345

(58) Field of Classification Search .......... 398/206, 398/209, 208; 330/308; 375/317, 345
See application file for complete search history.

(56) References Cited

U.S. PATENT DOCUMENTS

| 5,636,048 | A * | 6/1997 | Kogure et al. ......... 398/202 |
| 2002/0067532 | A1 * | 6/2002 | Yamashita et al. ..... 359/189 |
| 2002/0135845 | A1 | 9/2002 | Robinson et al. | |
| 2003/0016085 | A1 * | 1/2003 | Yamazaki ................ 330/308 |
| 2003/0020987 | A1 * | 1/2003 | Kanesaka ................ 359/158 |

FOREIGN PATENT DOCUMENTS

JP  1-227508  9/1989

(Continued)

OTHER PUBLICATIONS

Japanese Patent Office Action, mailed Oct. 30, 2007 and issued in corresponding Japanese Patent Application No. 2005-504696.

*Primary Examiner*—Jason Chan
*Assistant Examiner*—Nathan M Curs
(74) *Attorney, Agent, or Firm*—Staas & Halsey LLP (57) ABSTRACT

A preamplifier circuit, a clock switching circuit, and an optical receiver are provided that include a preamplifier that controls a bandwidth for conducting amplification on an input signal by varying a feedback resistance according to a control signal; a control signal generating part that determines the band of the output signal of the preamplifier to generate the control signal; and a correction signal generating part that generates a correction signal for correcting the control signal; wherein the correction signal corrects the control signal to adjust the feedback resistance. Accordingly, even when the number of rises and falls of an optical input signal in a given time period is less than a predetermined number range, the control signal may be properly generated to successfully conduct band control. Thus, an optical receiver that is not dedicated to a predetermined input signal pattern but is rather capable of automatically adjusting its bandwidth may be realized, and the cost of manufacturing the optical receiver structure may be reduced.

9 Claims, 11 Drawing Sheets

FOREIGN PATENT DOCUMENTS

| | | |
|---|---|---|
| JP | 1-253305 | 10/1989 |
| JP | 3-195107 | 8/1991 |
| JP | 3-270308 | 12/1991 |
| JP | 3-270504 | 12/1991 |
| JP | 5-335856 | 12/1993 |
| JP | 11-218624 | 8/1999 |
| JP | 2000-131541 | 5/2000 |
| JP | 2001-211035 | 8/2001 |
| JP | 2002-135214 | 5/2002 |
| JP | 2003-023398 | 1/2003 |
| WO | WO 01/67597 * | 9/2001 |
| WO | WO 1/67597 | 9/2001 |

* cited by examiner

PREAMPLIFIER CIRCUIT, CLOCK SWITCHING CIRCUIT, AND OPTICAL RECEIVER

CROSS REFERENCE TO RELATED APPLICATIONS

This application is a U.S. continuation application filed under 35 USC 111 (a) claiming benefit under 35 USC 120 and 365(c) of PCT application JP2004/000647, filed on Jan. 26, 2004, which claims priority to PCT application JP2003/000734, filed on Jan. 27, 2003. The foregoing applications are hereby incorporated herein by reference in their entirety.

BACKGROUND OF THE INVENTION

1. Field of the Invention

The present invention relates to a preamplifier circuit, a clock switching circuit, and an optical receiver implementing such circuits. Particularly, the present invention relates to a preamplifier circuit for amplifying a signal that is supplied to an optical receiver and is electrically converted through optical-to-electric conversion, and a clock switching circuit for switching a clock according to the transmission speed of an input signal.

2. Description of the Related Art

Figure 1:
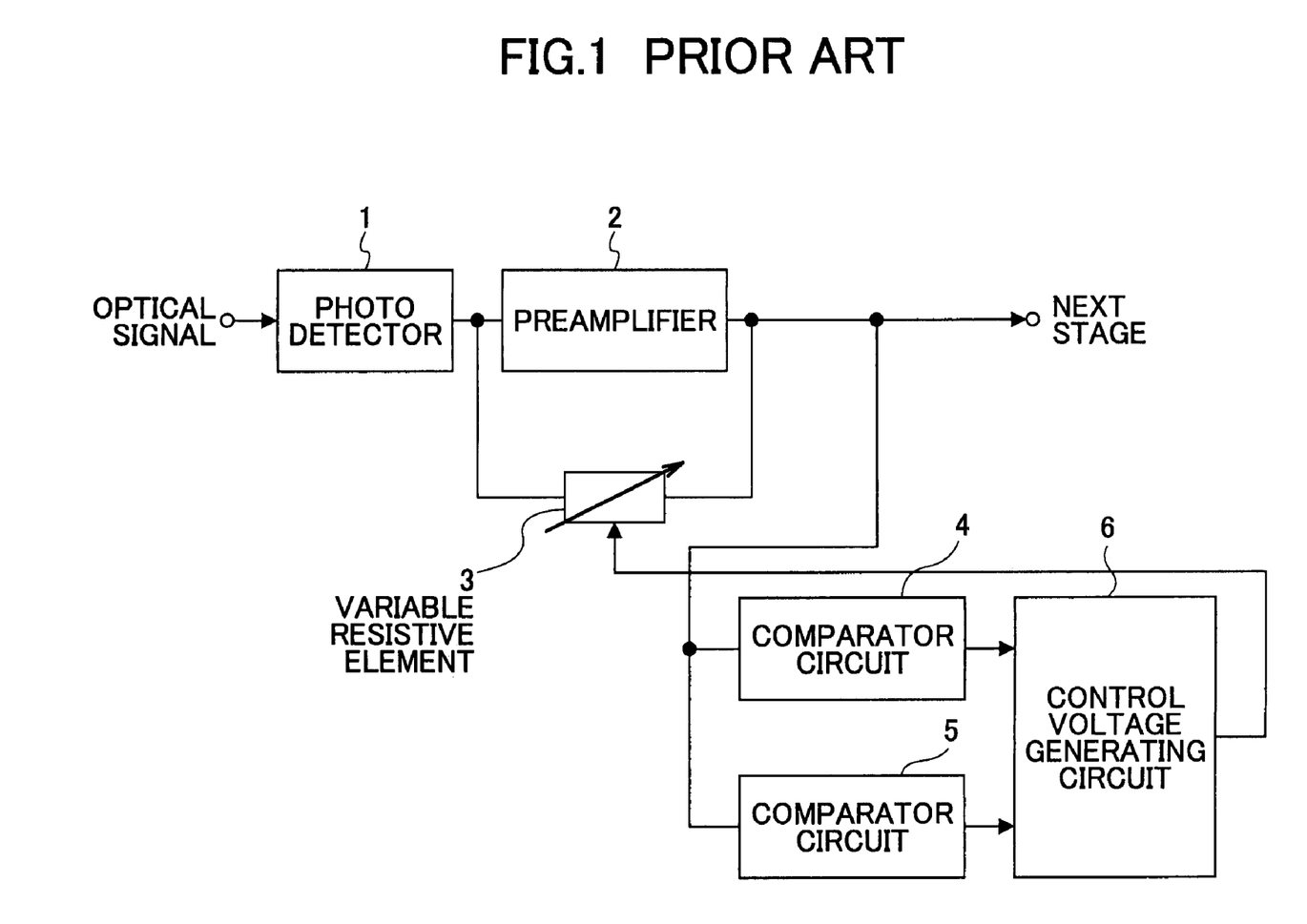
FIG. 1 is a block diagram illustrating an exemplary configuration of a preamplifier according to the prior art.

Exemplary configurations of a preamplifier circuit that amplifies a signal that is supplied to an optical receiver and is electrically converted through optical-to-electric conversion are disclosed in Japanese Patent Laid-Open Publication No. 3-195107 and Japanese Patent Laid-Open Publication No. 3-270504, for example. FIG. 1 is a block diagram showing an exemplary configuration of a preamplifier circuit according to the prior art. The illustrated preamplifier circuit includes a photo detector 1, a preamplifier 2, a variable resistive element 3, comparator circuits 4 and 5, and a control voltage generating circuit 6. The photo detector 1 converts an optical input signal into an electric signal through optical-to-electrical conversion. In turn, the preamplifier amplifies the output signal from the photo detector 1. The variable resistive element 3 is arranged to be parallel with the preamplifier 2 and its resistance may vary according to a bias signal applied thereto. The output signal from the preamplifier 2 is supplied to a next stage circuit and the comparator circuits 4 and 5.

The comparator circuit 4 compares the output signal from the preamplifier 2 with a first standard voltage and supplies the comparison result to the control voltage generating circuit 6. The comparator circuit 5 compares the output signal from the preamplifier 2 with a second standard voltage that is lower than the first standard voltage and supplies the comparison result to the control voltage generating circuit 6. The control voltage generating circuit 6 calculates an exclusive OR signal (i.e., rise and fall detection signal) from the comparison results, calculates an average value voltage of the exclusive OR signal, conducts differential amplification on the average value voltage and a standard voltage, and outputs the resulting amplified voltage as a control voltage. This control voltage is used as a bias voltage to be applied to the variable resistive element 3 to change the resistance of the variable resistive element 3.

In this way, the variable resistive element 3 may control the amount of voltage from the preamplifier 2 output that is to be fed back to the input side to control the gain and frequency bandwidth of the preamplifier 2 and adjust the frequency of the optical input signal to a suitable value.

However, in the preamplifier circuit of the prior art the number of rises and falls of the input signal within a certain time period must be within a predetermined range. Thereby, when the number of rises and falls of the optical input signal is below the predetermined range, the control voltage of the variable resistive element 3 may not be properly generated and band control may not be properly conducted.

It is desired that an optical receiver be capable of accurately realizing the so-called 3R functions, namely, reshaping, retiming, and regenerating a signal light.

Figure 2:
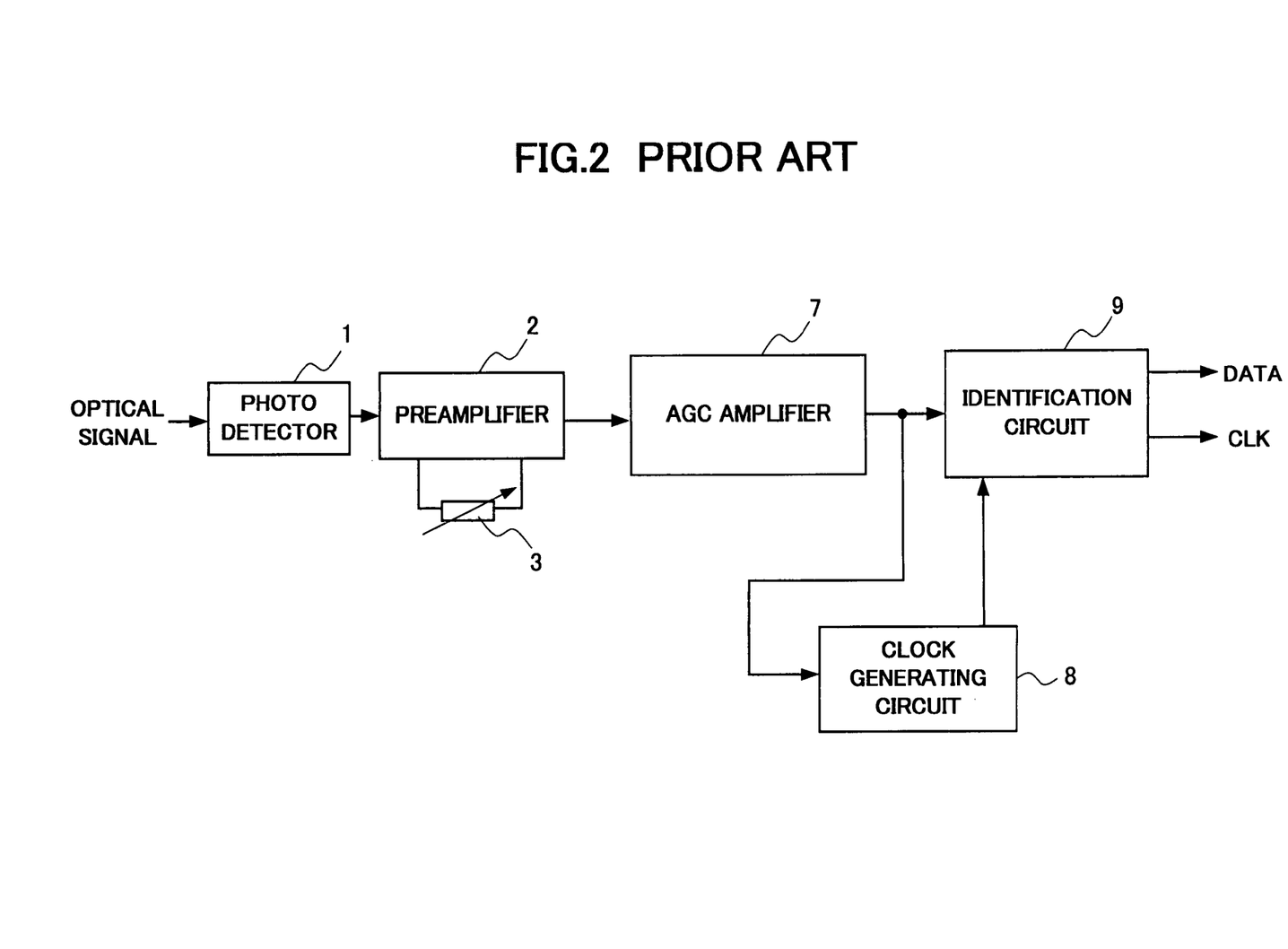
FIG. 2 is a block diagram illustrating an exemplary configuration of an optical receiver according to the prior art.

FIG. 2 is a block diagram showing an exemplary configuration of an optical receiver according to the prior art. It is noted that components shown in this drawing that are identical to those shown in FIG. 1 are given the same numerical notations. It is also noted that the comparator circuits 4 and 5 and the control voltage generating circuit 6 are omitted from this drawing. In the illustrated optical receiver, the photo detector 1 converts an optical input signal into an electric signal through optical-to-electric conversion. The output signal of the photo detector 1 is amplified by the preamplifier 2. The variable resistive element 3 is arranged to be parallel with the preamplifier 2, and its resistance may be changed by a bias voltage.

The output signal from the preamplifier 2 passes through an AGC (automatic gain control) amplifier 7 to be supplied to a clock generating circuit 8 and an identification circuit 9. The clock generating circuit 8 generates a clock that is in sync with a clock component included in the output signal from the AGC amplifier 7 using a PLL or SAW filter and supplies the generated clock to the identification circuit 9. The identification circuit 9 samples the output signal from the AGC amplifier 7 using the clock from the clock generating circuit 8, reproduces the sampled data, and outputs the data along with the clock.

The optical receiver according to the prior art is designed in accordance with the transmission speed of the signal light being used so as to properly realize the 3R functions. For example, dedicated optical receivers are designed for transmission speeds of 622 Mb/s, 2.48 Gb/s, and 10 Gb/s, respectively.

In such case, for example, if the preamplifier 2 and the AGC amplifier 7 that realize equalizing amplification are designed for a transmission speed of 2.48 Gb/s, when a signal that has a higher transmission speed than the equalizing band (2.48 Gb/s) such as a transmission signal of 10 Gb/s is received at the optical receiver, the received signal (10 Gb/s) may be subject to band restriction at the equalizing amplifiers thereby resulting in deformation of the waveform and degradation of the reception characteristics of the signal. Also, when a signal that has a lower transmission speed than the equalizing band such as a transmission signal of 622 Mb/s is received at the optical receiver, a high frequency noise component of the receives signal may be increased thereby resulting in degradation of the reception characteristics.

As can be appreciated from the above descriptions, a preamplifier that is adapted for the transmission speed of the signal light being used needs to be implemented, and accordingly, in order to realize a structure for receiving signals with transmission speeds of 622 Mb/s, 2.48 Gb/s, and 10 Gb/s, respectively, three types of optical receivers are needed. However, such a structure results in an increase in the circuit size and manufacturing cost.

SUMMARY OF THE INVENTION

It is a general object of the present invention to provide a preamplifier circuit, a clock switching circuit, and an optical receiver using such circuits that is not dedicated to a predetermined input signal pattern but is rather capable of automatically adjusting its bandwidth and automatically conducting clock switching according to the transmission speed of the input signal to thereby realize cost reduction.

According to an embodiment of the present invention, a preamplifier circuit is provided that includes a preamplifier that controls a bandwidth for amplifying an input signal by varying a feedback resistance according to a control signal, and a control signal generating part that determines the band of an output signal of the preamplifier to generate the control signal, and a correction signal generating part that generates a correction signal for the control signal, wherein the control signal is corrected by the correction signal and the feedback resistance is adjusted by the corrected control signal.

According to another embodiment of the present invention, a clock switching circuit is provided that includes an amplifying part configured to control a bandwidth for amplifying an input signal by varying a feedback resistance according to a control signal, the input signal corresponding to one of a plurality of input signals with differing transmission speeds, a control signal generating part configured to determine a band of an output signal from the amplifying part and generate the control signal based on the determined band, a correction signal generating part configured to generate a correction signal for correcting the control signal, and a clock switching part configured to detect a transmission speed of the input signal based on a corrected control signal that is obtained by correcting the control signal with the correction signal and is used for adjusting the feedback resistance, generate a standard clock that corresponds to a clock for an input signal with a maximum transmission speed of the differing transmission speeds, and identify the output signal of the amplifying part according to the transmission speed detection result.

According to another embodiment of the present invention, an optical receiver that includes a preamplifier circuit of the present invention is provided. According to another embodiment of the present invention, an optical receiver including a clock switching circuit of the present invention is provided.

According to an aspect of the present invention, even when the number of rises and falls of an optical input signal in a given time period is less than a predetermined number range, a control voltage may be properly generated and band control may be accurately conducted. According to an aspect of the present invention, an optical receiver that is not dedicated to a predetermined input signal pattern but is rather capable of automatically controlling a bandwidth may be realized to thereby reduce the cost of the optical receiver structure.

DESCRIPTION OF THE PREFERRED EMBODIMENTS

In the following, preferred embodiments of the present invention are described with reference to the accompanying drawings.

Figure 3:
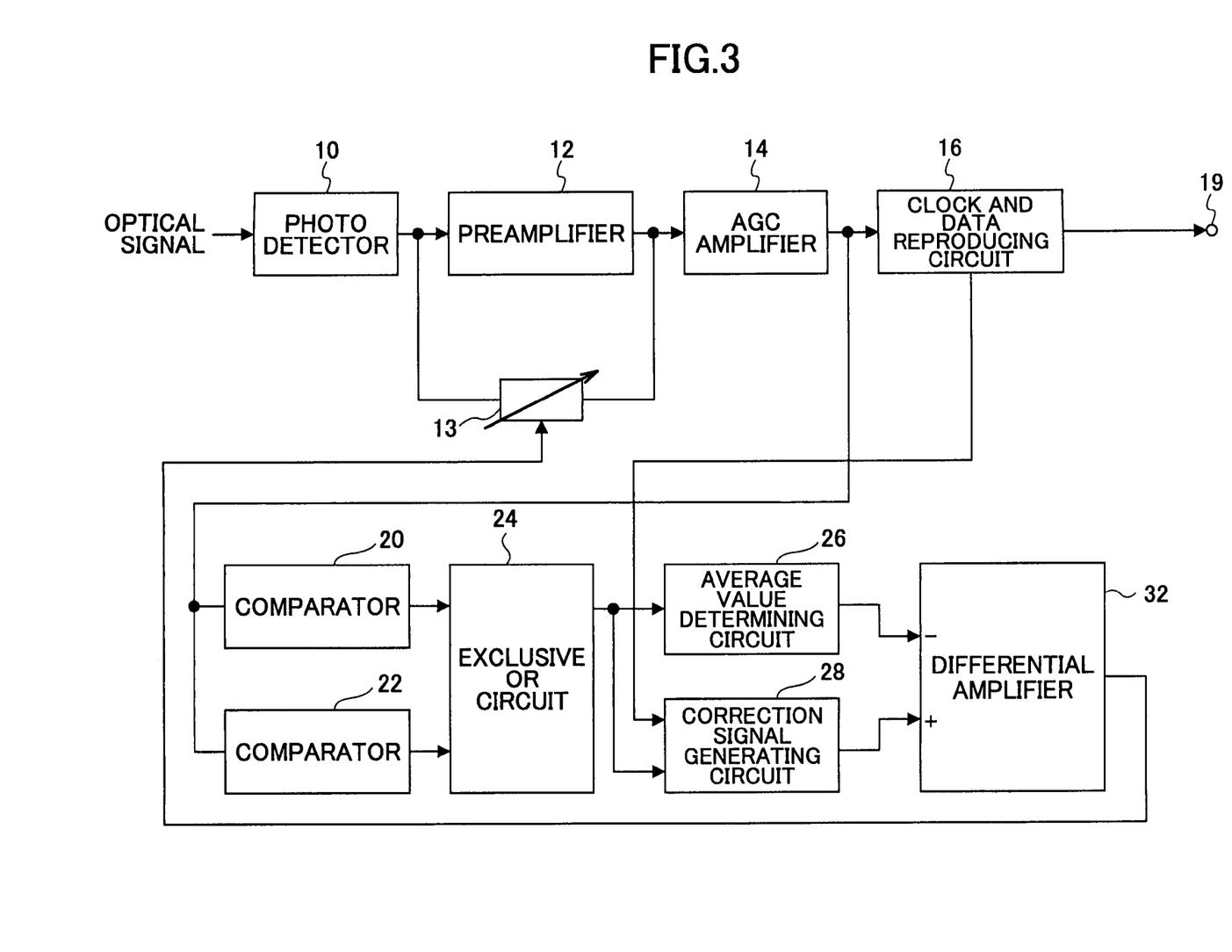
FIG. 3 is a block diagram illustrating a configuration of an optical receiver implementing a preamplifier according to an embodiment of the present invention.
Figure 4:
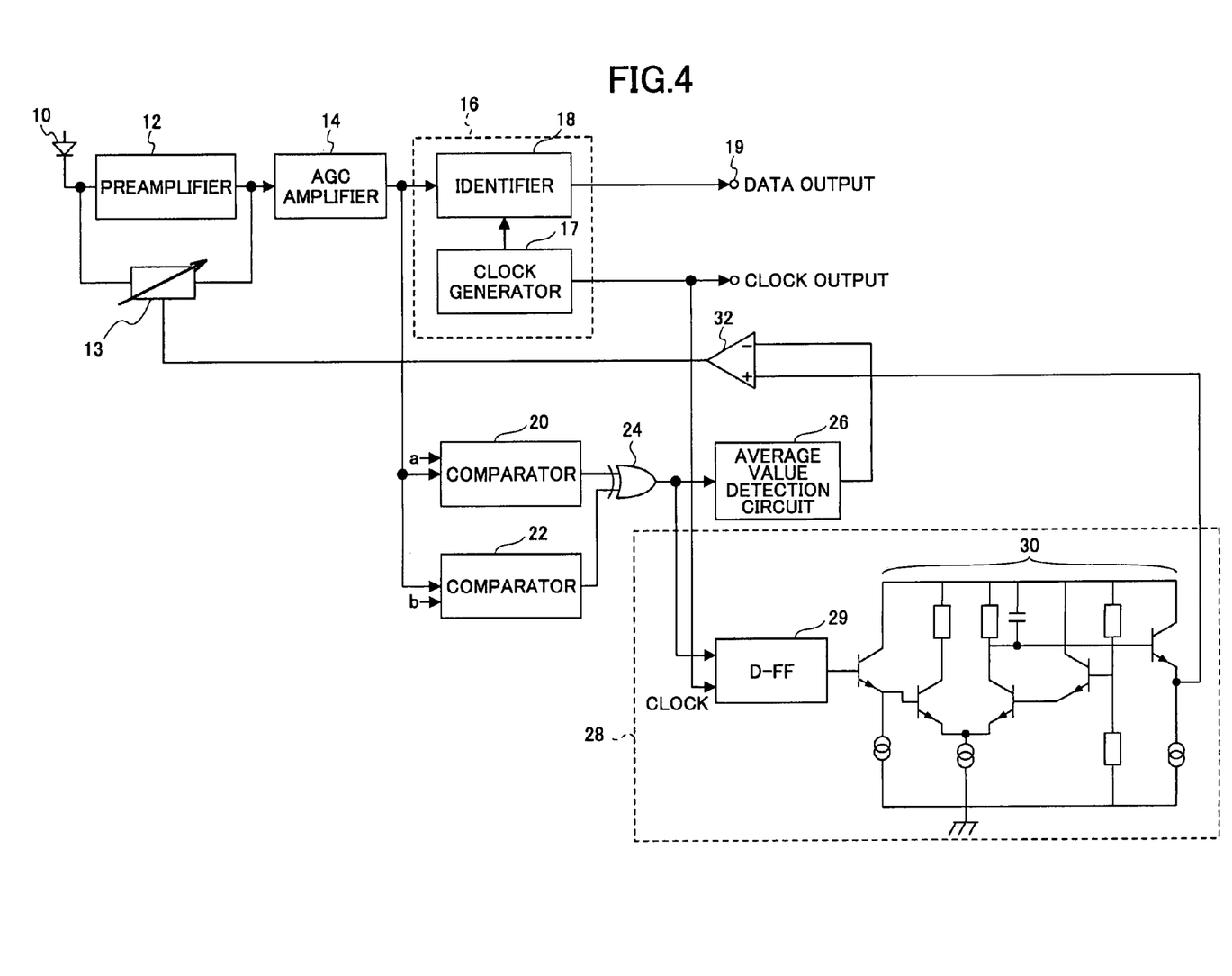
FIG. 4 is a block diagram illustrating a detailed configuration of a correction signal generating circuit of the optical receiver according to the present embodiment.

FIG. 3 is a block diagram illustrating a configuration of an optical receiver implementing a preamplifier according to an embodiment of the present invention. FIG. 4 is a block diagrams illustrated a detailed configuration of the optical receiver according to the present embodiment. The optical receiver according to the present embodiment, a photo detector 10, a preamplifier 12, a variable resistive element 13, an AGC amplifier 14, a clock and data reproducing circuit 16, comparators 20 and 21, an exclusive OR circuit 24, an average value determining circuit 26, a correction signal generating circuit 28, and a differential amplifier 32. The photo detector 10 may be realized by a photo diode and be arranged to conduct optical-to-electric conversion on an optical input signal. The output signal of the photo detector 10 may be amplified at the preamplifier 12. The variable resistive element 13 is arranged to be parallel with the preamplifier 12 and its resistance may be changed by a bias voltage. The AGC amplifier 14 conducts gain control on a signal that is amplified at the preamplifier 12 to control an output level of the output signal to be at a predetermined level, and supplies the output signal to the clock and data reproducing circuit 16, and comparators 20 and 22.

Figure 5:
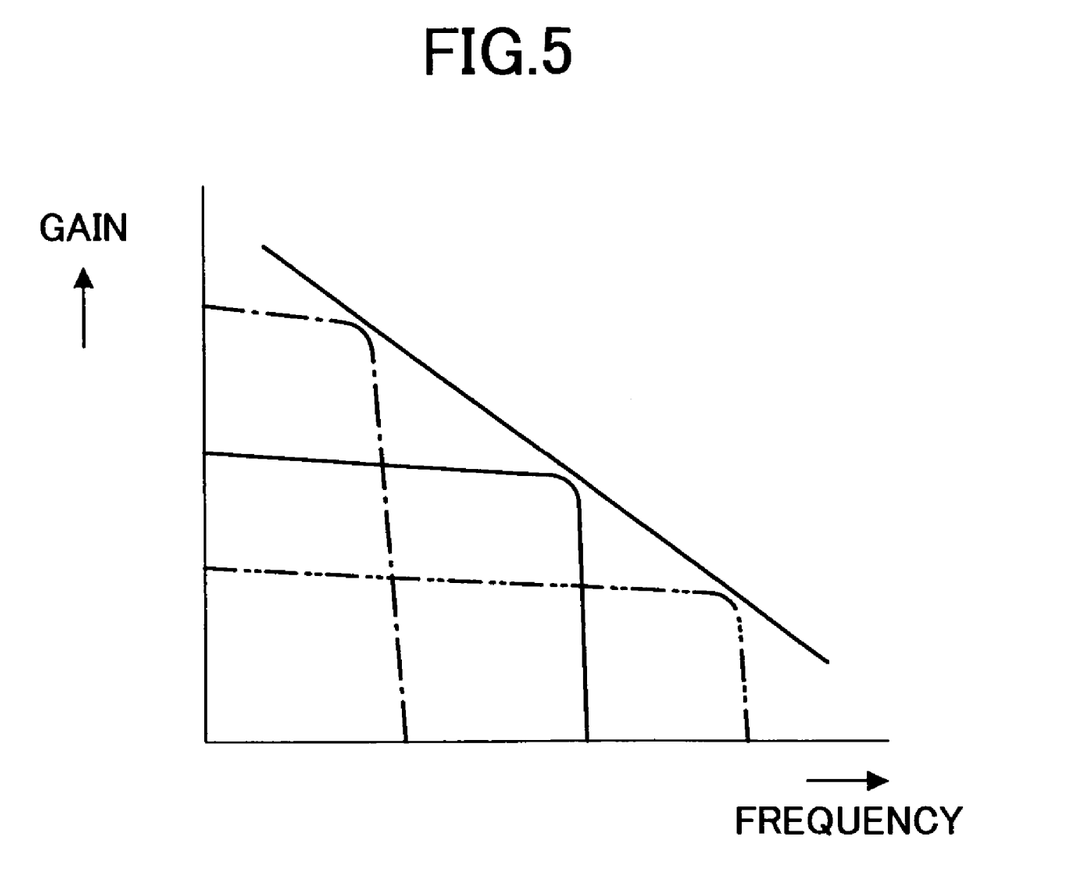
FIG. 5 is a diagram illustrating a characteristic of the preamplifier according to the resistance of a variable resistive element.

Referring to FIG. 5, the preamplifier 12, which realizes feedback through the variable resistive element 13, may have a narrow frequency bandwidth and a large gain when the bias voltage is high so that the resistance of the variable resistive element 13 is large and the amount of feedback is small (see one-dotted line in FIG. 5). On the other hand, when the bias voltage is low so that the resistance of the variable resistive element 13 is small and the amount of feedback is large, the preamplifier 12 may have a wide frequency bandwidth and a small gain (see two-dotted line of FIG. 5). When the resistance of the variable resistive element 13 is mid-range and the amount of feedback is mid-range, the preamplifier 12 may have a mid-range frequency bandwidth and gain (see solid line of FIG. 5).

It is noted that in the present example, the preamplifier 12 for the photo detector 10 is preferably arranged to meet the following conditions. Namely, given that 'fi' denotes the frequency of the optical input signal, and 'fc' denotes the cutoff frequency, fi≈0.8 fc. Accordingly, the resistance of the variable resistive element 13 is preferably controlled to satisfy the condition fi≈0.8 fc.

As is shown in FIG. 4, the clock and data reproducing circuit 16 includes a clock generator 17 and an identifier 18. The identifier 18 samples and identifies the output signal from the AGC amplifier 14 using the clock generated by the clock generator 17, and outputs the identification result as acquired data to a terminal 19.

The comparator 20 compares the output signal from the AGC amplifier 14 with a first standard voltage, and the comparator 22 compares the output signal from the AGC amplifier 14 with a second standard voltage that is lower than the first standard voltage. The respective output signals of the comparators 20 and 22 are input to the exclusive OR circuit 24 to obtain an exclusive OR signal. The exclusive OR signal, namely, a rise and fall detection signal, is supplied to the average value detection circuit 26 and the correction signal generating circuit 28.

The average value detection circuit 26 detects the average value voltage of the exclusive OR signal and supplies the detection result to an inverting input terminal of the differential amplifier 32. The correction signal generating circuit 28 includes a D flip flop (D-FF) 29 and an integrator 30. The D flip flop 29 samples the exclusive OR signal using the data identification clock supplied by the clock generating circuit 17 to arrange the pulse width of the exclusive OR signal to be at least equal to the clock period, and supplies the sampled signal to the integrator 30. The integrator 30 integrates the pulse-width controlled exclusive OR signal and supplies the integrated value voltage to a non-inverting input terminal of the differential amplifier 32.

The differential amplifier 32 conducts differential amplification on the integrated value and the average voltage to generate a control voltage. The control voltage is applied to the variable resistive element 13 to be used as a bias voltage for controlling the resistance of the variable resistive element 13. The variable resistive element 13 feeds back the output of the preamplifier 12 to its input side. By controlling the resistance of the variable resistive element 13, the gain and frequency bandwidth of the preamplifier 12 may be suitably adjusted according to the frequency of the optical input signal.

In a case where the pass band of the preamplifier 12 is a wide band that reaches a high frequency (e.g., two-dotted line of FIG. 5), the rise and fall of the exclusive OR signal may be abrupt and thereby, the pulse width of the exclusive OR signal may be narrow. In a case where the pass band of the optical input signal is a narrow band (e.g., one-dotted line of FIG. 5), the rise and fall of the exclusive OR signal may be gradual, and thereby, the pulse width of the exclusive OR signal may be wide.

Figure 6:
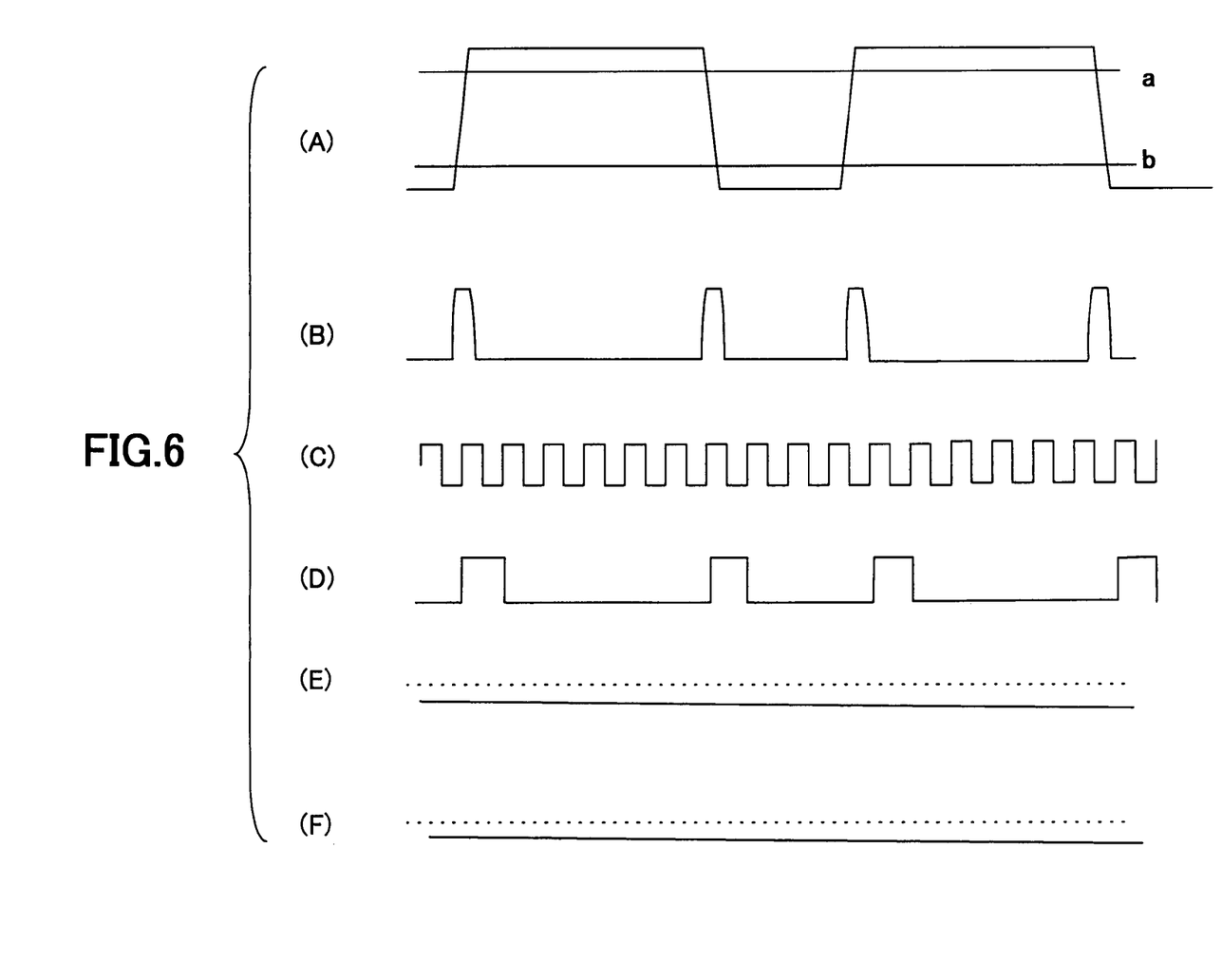
FIG. 6 is a diagram illustrating signal waveforms used according to an embodiment of the present invention.

In a case where the number of rises and falls of the input signal is less than a predetermined number range, the pass band of the preamplifier 12 preferably corresponds to a narrow band. When the pass band of the preamplifier 12 corresponds to a wide band, the output signal from the AGC amplifier 14 may have a waveform as is shown in FIG. 6(A). The illustrated waveform represents a signal pattern with a small number of rises and falls. In this drawing, the first and second standard voltages of the comparators 20 and 22 are represented by 'a' and 'b', respectively.

When the pass band of the preamplifier 12 corresponds to a wide band, the exclusive OR signal output by the exclusive OR circuit 24 may have a waveform with a narrow pulse width as is shown in FIG. 6(B). According to the present embodiment, the correction signal generating circuit 28 adjusts the exclusive OR signal so that its pulse width may be at least equal to the clock period of a clock as is shown in FIG. 6(C). Thereby, the exclusive OR signal output by the D flip flop 29 may have a waveform as is shown in FIG. 6(D), and the integrated value voltage output by the integrator 30 may be higher than the average value voltage output by the average value detection circuit 26. The hatched lines shown in FIG. 6(E) and(F) represent the average value voltage and the integrated value voltage, respectively. The solid lines of FIG. 6(E) and (F) represent voltages in a case where the exclusive OR pulse signal is not output.

In this case, the control voltage, that is, the bias voltage of the variable resistive element 13 may increase and the pass band of the preamplifier 12 may be arranged to correspond to a narrow band. When the pass band of the preamplifier 12 is arranged to be a narrow band, the pulse width of the exclusive OR signal output by the exclusive OR circuit 24 may be arranged to be wider than that shown in FIG. 6(B), and the control voltage may stabilize when it reaches the waveform state as is shown in FIG. 6(D).

According to the present embodiment, even when the number of rises and falls of an optical input signal within a certain period is less than a predetermined number range, a control voltage may be properly generated and accurate band control may be realized. That is, according to the present embodiment an optical receiver that is not dedicated to a predetermined input signal pattern but is rather capable of automatically adjusting its bandwidth may be realized so that the cost of manufacturing the optical receiver structure may be reduced.

Figure 7:
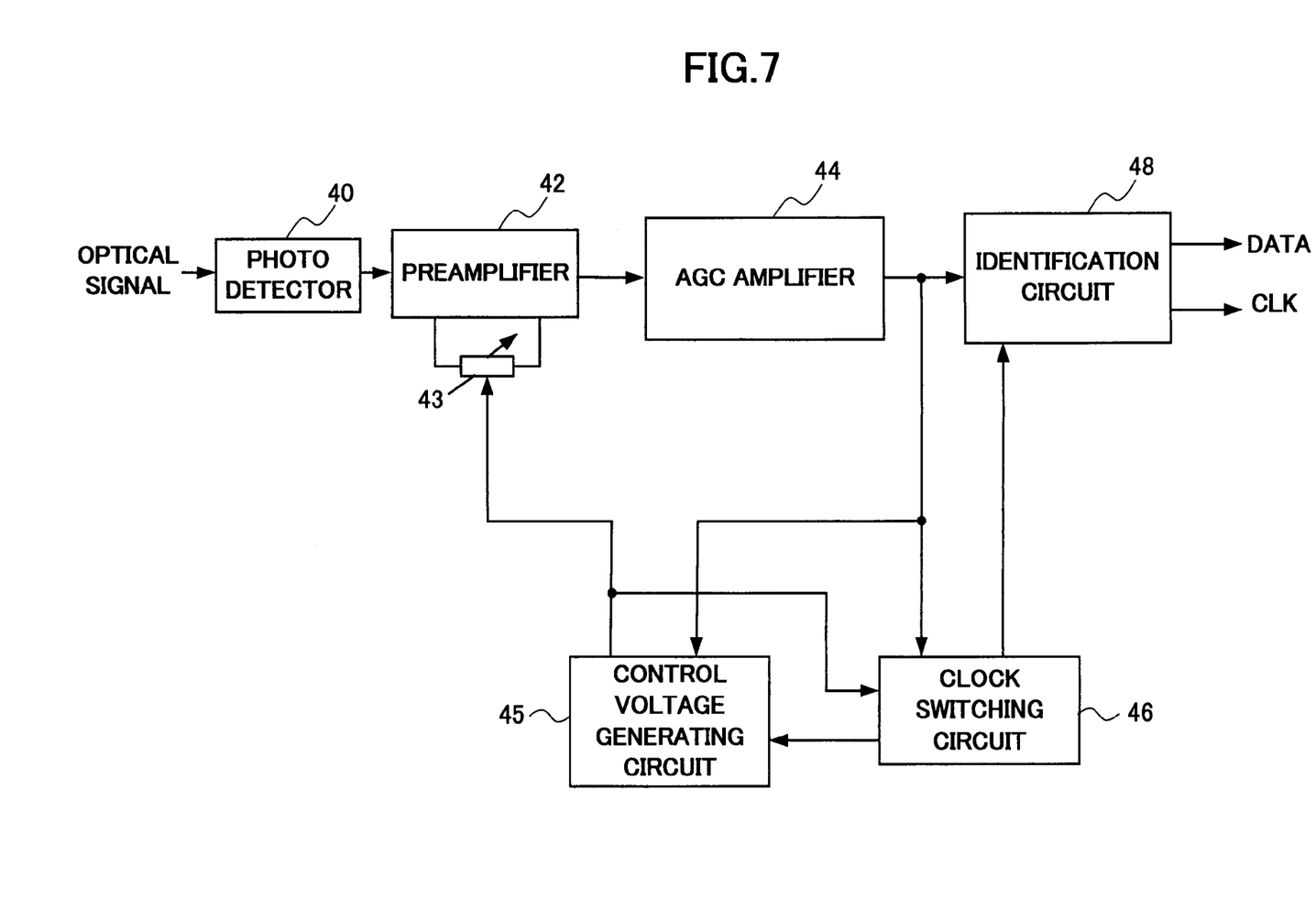
FIG. 7 is a block diagram illustrating a configuration of an optical receiver implementing a preamplifier and clock switching circuit according to an embodiment of the present invention.
Figure 8:
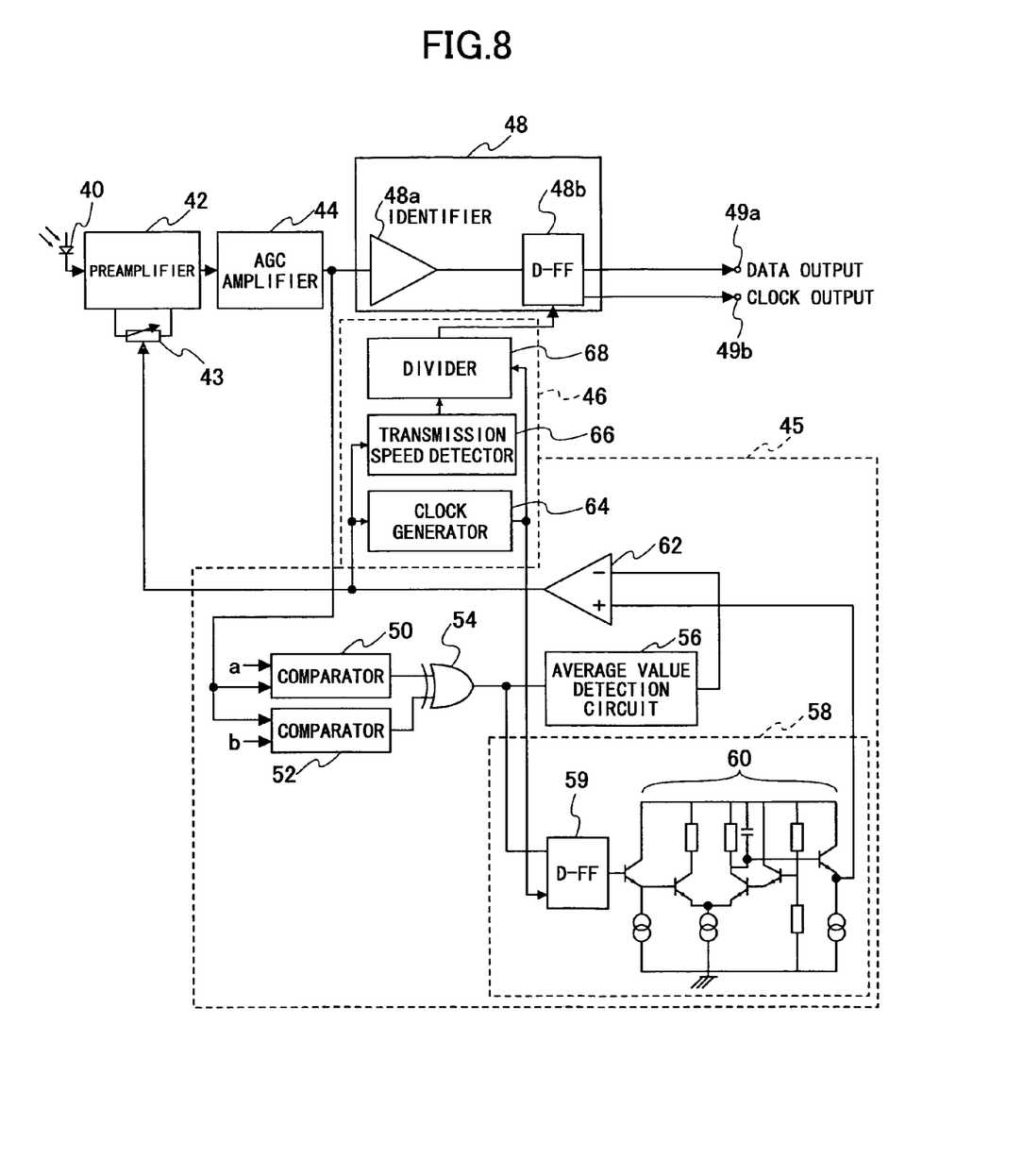
FIG. 8 is a block diagram illustrating a detailed configuration of an identification circuit and a control voltage generating circuit of the optical receiver according to the present embodiment.

FIG. 7 is a block diagram showing a configuration of an optical receiver implementing a preamplifier circuit and a clock switching circuit according to an embodiment of the present invention. FIG. 8 is a block diagram showing a more detailed configuration of the optical receiver according to the present embodiment. The optical receiver shown in these drawings includes a photo detector 40, a preamplifier 42, a clock switching circuit 42, an AGC amplifier 44, a control voltage generating circuit 45, a clock switching circuit 46, and an identification circuit 48. The photo detector 40 may be made of a photo diode, for example, and may be arranged to conduct optical-to-electric conversion on an optical input signal. In the present example, it is assumed that the optical receiver may receive various optical signals having different transmission speeds of 622 Mb/s, 2.48 Gb/s, or 10 Gb/s.

According to the present embodiment, an output signal from the photo detector 40 is amplified at the preamplifier 42. The variable resistive element 43, which has a variable resistance that may change according to a bias voltage, is arranged in parallel with the preamplifier 42. Then, at the AGC amplifier 44, gain control is conducted on the amplified signal output from the preamplifier 42 so that its output signal may be controlled to a predetermined output level. The resulting gain-controlled output signals are then supplied to the control voltage generating circuit 45, the clock switching circuit 46, and the identification circuit 48, respectively. In other words, equalizing amplification is realized by the preamplifier 42 and the AGC amplifier 44.

The preamplifier 42, which realizes feedback through the variable resistive element 43, may have a narrow frequency bandwidth and a large gain when the bias voltage is high so that the resistance of the variable resistive element 13 is large and the amount of feedback is small (see one-dotted line in FIG. 5). On the other hand, when the bias voltage is low so that the resistance of the variable resistive element 43 is small and the amount of feedback is large, the preamplifier 42 may have a wide frequency bandwidth and a small gain (see two-dotted line of FIG. 5). When the resistance of the variable resistive element 43 is mid-range and the amount of feedback is mid-range, the preamplifier 42 may have a mid-range frequency bandwidth and gain (see solid line of FIG. 5).

It is noted that in the present example, the preamplifier 42 for the photo detector 40 is preferably arranged to meet the following conditions. Namely, given that 'fi' denotes the frequency of the optical input signal, and 'fc' denotes the cutoff frequency, fi≈0.8 fc. Accordingly, the resistance of the variable resistive element 43 is preferably controlled to satisfy the condition fi≈0.8 fc.

As is shown in FIG. 8, the control voltage generating circuit 45 includes comparators 50 and 52, an exclusive OR circuit 54, an average value detection circuit 56, a correction signal generating circuit 58, and a differential amplifier 62.

The comparator 50 compares the output signal from the AGC amplifier 44 with a first standard voltage, and the comparator 52 compares the output signal from the AGC amplifier 44 with a second standard voltage that is lower than the first standard voltage. The respective output signals of the comparators 50 and 52 are input to the exclusive OR circuit 54 to obtain an exclusive OR signal. The exclusive OR signal, namely, a rise and fall detection signal, is supplied to the average value detection circuit 56 and the correction signal generating circuit 58. The average value detection circuit 56 detects an average value voltage of the exclusive OR signal and supplies the detected average value voltage to an inverting input terminal of the differential amplifier 62.

The correction signal generating circuit 58 includes a D flip flop 59 and an integrator 60. The D flip flop 59 samples the exclusive OR signal using a standard clock supplied by the clock switching circuit 46 and controls the pulse width of the exclusive OR signal to be at least equal to the standard clock period. The resulting pulse-width controlled exclusive OR signal is then supplied to the integrator 60. The integrator 60 integrates the pulse-width-controlled exclusive OR signal and supplies the integrated value voltage to a non-inverting input terminal of the differential amplifier 62. It is noted that in a case where the transmission speed of the optical input signal may correspond to 622 Mb/s, 2.48 Gb/s, or 10 Gb/s, the standard clock may correspond to a clock for identifying data of an optical input signal with the highest possible transmission speed of 10 Gb/s.

The differential amplifier 62 conducts differential amplification on the integrated value voltage and the average value voltage to generate a control voltage. This control voltage is supplied to the variable resistive element 43 as a bias voltage, and is also supplied to the clock switching circuit 46. The resistance of the variable resistive element 43 may change according to the control voltage. The variable resistive element 13 feeds back the output of the preamplifier 42 to its input side, and by controlling the resistance of the variable input, it is able to suitably adjust the gain and frequency bandwidth of the preamplifier 42 according to the frequency of the optical input signal.

When the pass band of the preamplifier 42 corresponds to a wide band, the exclusive OR signal may have a waveform with a narrow pulse width. When the pass band of the preamplifier 42 corresponds to a narrow band, the rise and fall of the exclusive OR signal may be gradual and the pulse width of the exclusive OR signal may be wider. Thereby, even when the number of rises and falls of an optical input signal within a certain time period is less than a predetermined number range, the control voltage may be accurately generated and band control may be properly realized. That is, the bandwidth may be automatically controlled regardless of the input signal pattern as is described above.

The clock switching circuit 46 includes a clock generator 64, a transmission speed detector 66, and a divider unit 68. The clock generator 64 uses a PLL filter or a SAW filter to generate a standard clock that is in synch with a clock component included in the output signal of the AGC amplifier 44, and supplies the generated standard clock to the divider unit 68 and the D flip flop 59. It is noted that when the transmission speed of the optical input signal corresponds to an integral multiple of 22 Mb/s, 2.48 Gb/s, or 10 Gb/s, the frequency of the standard clock is arranged to be 10 GHz, which corresponds to the frequency for the optical input signal with the maximum transmission speed, regardless of the transmission speed of the optical signal currently being input.

Figure 9:
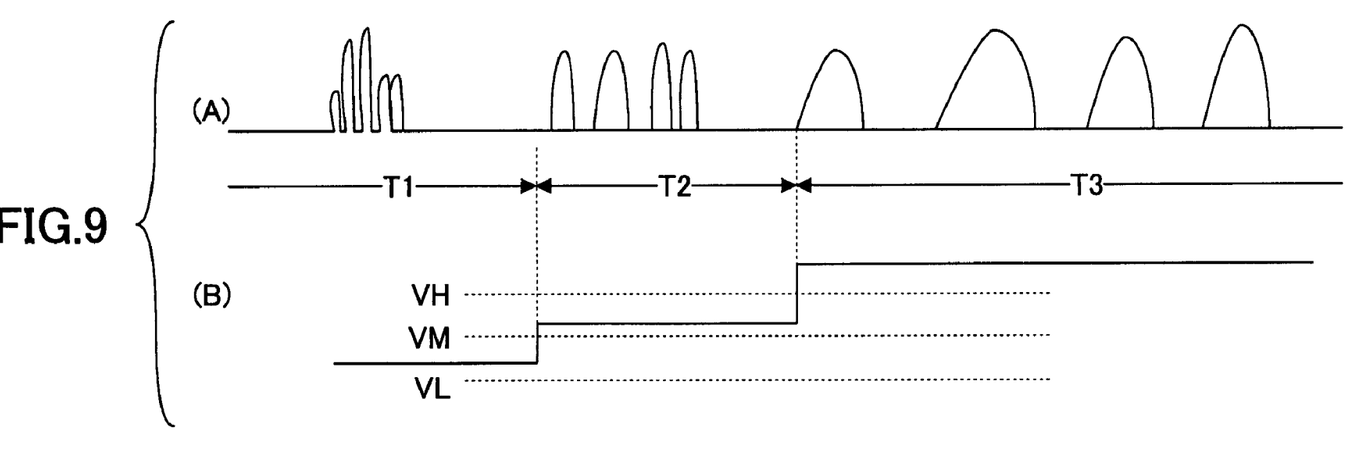
FIG. 9 is a diagram illustrating a relation between the transmission speed of an optical input signal and the voltage level of a control voltage.

The transmission speed detector 66 compares the control voltage from the differential amplifier 62 with threshold values VH, VM, and VL, respectively, to detect the transmission speed of the optical input signal. The divider unit 68 divides the frequency of the standard clock according to the transmission speed detection result. For example, referring to FIG. 9, in a case where the transmission speed of the optical input signal changes from 10 Gb/s during time period T1, to 2.48 Gb/s during time period T2, and to 622 Mb/s during time period T3 as is shown in FIG. 9(A), the voltage level of the control voltage may change as is illustrated in FIG. 9(B). It is noted that in FIG. 9(B) the threshold values VH, VM, and VL are shown along with the control voltage levels.

According to the present embodiment, in a case where the transmission speed is low, if the pass band of the preamplifier 42 corresponds to a wide band, the pulse width of the exclusive OR signal that is output by the exclusive OR circuit 54 may be narrow, and in turn, the correction signal generating circuit 58 may adjust the pulse width of the exclusive OR signal to correspond to the standard clock period. Consequently, the integrated value voltage may be higher than the average value voltage, and thereby, the control voltage, namely, the bias voltage for the variable resistive element 13 may be increased. In turn, the pass band of the preamplifier 12 may be narrowed, and the control voltage may stabilize when the pulse width of the exclusive OR signal output by the exclusive OR circuit 24 approximately corresponds to the pulse width of the output signal of the D flip flop 59.

Figure 10:
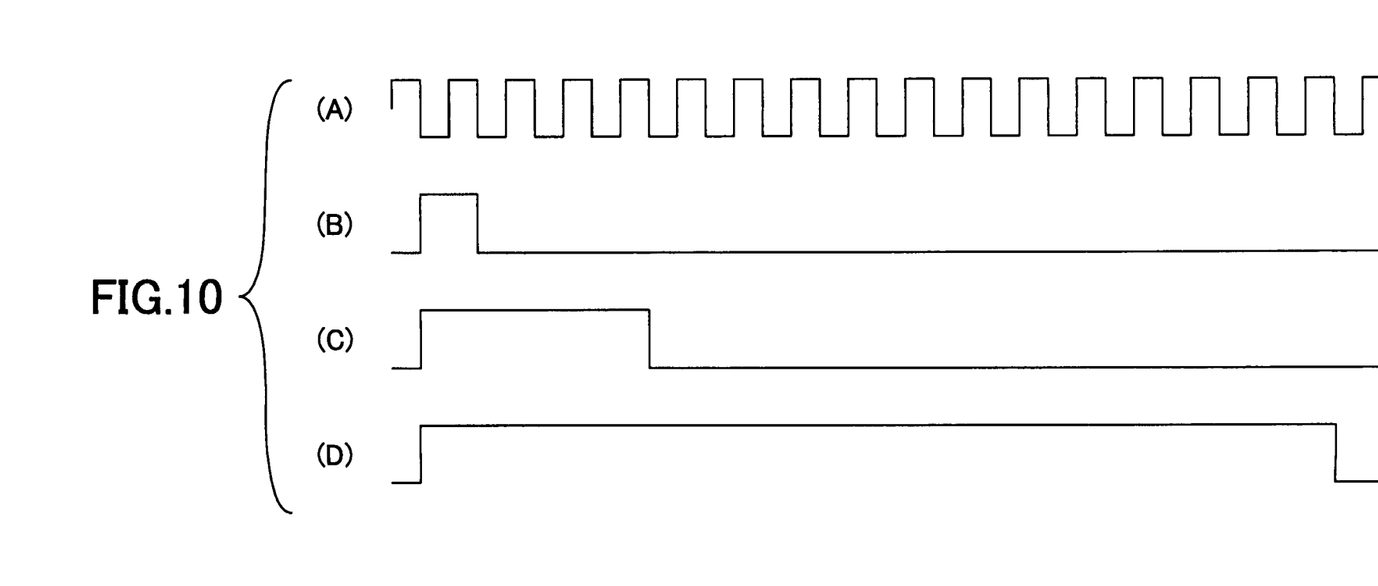
FIG. 10 is a diagram illustrating waveforms of exclusive OR signals according to differing transmission speeds based on a standard clock.

FIG. 10(A) illustrates a waveform of the standard clock (10 GHz), and FIG. 10(B), (C), and (D) illustrate waveforms (for one pulse) of the exclusive OR signals output by the D flip flop 59 when their corresponding optical input signals have transmission speeds of 10 Gb/s, 2.48 Gb/s, and 622 Mb/s, respectively.

Figure 11:
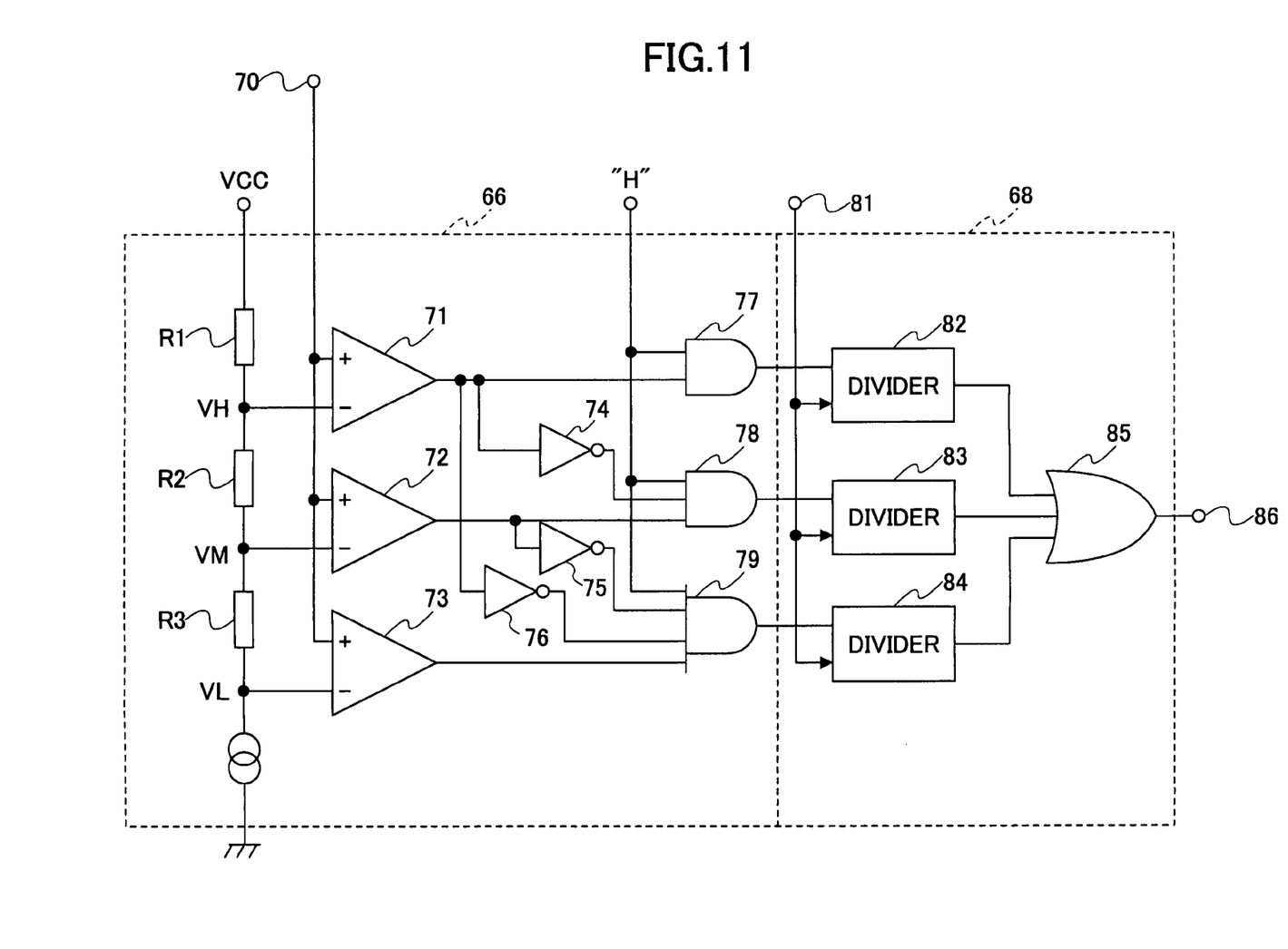
FIG. 11 is a diagram illustrating a circuit configuration of a transmission speed detection part and a frequency division part according to an embodiment of the present invention.

FIG. 11 illustrates circuit configurations of the transmission speed detector 66 and the divider unit 68 according to an embodiment of the present invention. In this drawing, serially connected resistors R1, R2, and R3 are arranged to divide a power source voltage Vcc to generate threshold value voltages VH, VM, and VL, and supply the generated threshold value voltages to inverting input terminals of comparators 71, 72, and 73. It is noted that a control voltage output from the differential amplifier 62 is input to a terminal 70 of the transmission speed detector 66 to be supplied to non-inverting input terminals of the comparators 71, 72, and 73.

The comparator 71 is arranged to output a low level output voltage when the control voltage is less than the threshold value VH, and output a high level output voltage when the control voltage is greater than the threshold value VH. The comparator 72 is arranged to output low level output voltage when the control voltage is less than the threshold value VM and output a high level output voltage when the control voltage is greater than the threshold value VM. The comparator 73 is arranged to output a low level output voltage when the control voltage is less than the threshold value VL, and output a high level output voltage when the control voltage is greater than the threshold value VL.

The output of the comparator 71 is supplied to inverters 74 and 76, and an AND circuit 77. The output of the comparator 72 is supplied to an inverter 75 and an AND circuit 78. The output of the comparator 73 is supplied to an AND circuit 79.

The AND circuit 77 outputs a high level voltage when the control voltage exceeds the threshold value VH to thereby enable operation of a divider 82 of the divider unit 68. It is noted that a standard clock is supplied to the divider 82 as well as to dividers 83 and 84 from the clock generator 64 via a terminal 81. In turn, the divider 82 divides the 10 GHz standard clock by 1/16 to generate a clock with a frequency of 622 MHz.

The AND circuit 78 outputs a high level voltage when the control voltage is within the range between the threshold value VM and the threshold value VH to thereby enable operation of the divider 83. In turn, the divider 83 divides the 10 GHz standard clock by 1/4 to generate a clock with a frequency of 2.48 GHz.

The AND circuit 79 outputs a high level voltage when the control voltage is within a range of the threshold value VL and the threshold value VM to thereby enable operation of the divider 84. In turn, the divider 84 divides the 10 GHz standard clock signal by 1/1 to generate a clock with a frequency of 10 GHz. It is noted that in practice, the divider 84 does not conduct frequency division of the standard clock, and thereby, a transmission gate may be used instead the divider 83, for example. A clock output from any one of the dividers 82, 83, or 84 is supplied to the identification circuit 48 via an OR circuit 85.

It is noted that according to the present embodiment, the control voltage is compared with the threshold values VH, VM, and VL at the transmission detector 66; however, the present invention is note limited to such an embodiment, and for example, the control voltage may be compared with the threshold values VH and VM to determine the frequency division ratio (1/16, 1/4, or 1/1).

The identification circuit 48 includes an identifier 48a and a D flip flop 48b. The identifier 48a is arranged to identify the output signal of the AGC amplifier 44, and the D flip flop 48b is arranged to sample the output signal using the clock supplied from the divider 68. Then, data acquired by the identification circuit 48 containing the identification result are output from a terminal 49a, and at the same time, the clock is output from a terminal 49b.

According to the present embodiment, clock switching may be automatically conducted according to the transmission speed of the input signal, and thereby, signal light with differing transmission speeds of 622 Mb/s, 2.48 Gb/s, and 10 Gb/s may be received by an optical receiver that is made up of a single circuit. In this way, the circuit size and the cost of the optical receiver may be reduced.

It is noted that according to an embodiment, the average detection circuit 26, the differential amplifier 32, the comparators 20 and 22, and the exclusive OR circuit 24 may correspond to a control signal generating part; the correction signal generating circuit 28 may correspond to a correction signal generating part; the comparator 20 may correspond to a first comparator; the comparator 22 may correspond to a second comparator; the AGC amplifier 14 may correspond to an AGC part; the clock and data reproducing circuit 16 may correspond to a data identifying/reproducing part; the transmission speed detector 66 may correspond to a transmission speed detecting part; the clock generator 64 may correspond to a clock generating part; and the divider unit 68 may correspond to a dividing part of the present invention.

Further, the present invention is not limited to the specific embodiments described above, and variations and modifications may be made without departing from the scope of the present invention.

What is claimed is:

1. An optical receiver, comprising:
a photodetector for detecting an input signal;
a clock switching circuit including an amplifying part having a preamplifier configured to control a bandwidth for amplifying the input signal by varying a feedback resistance according to a control signal;
an AGC part configured to control a level of an output signal of the preamplifier to a fixed level and to output the level-controlled signal, the input signal corresponding to one of a plurality of input signals with differing transmission speeds;
a control signal generating part configured to determine a band of an output signal from the amplifying part and to generate the control signal based on the determined band;
a correction signal generating part configured to generate a correction signal for correcting the control signal, based on the output signal of the preamplifier and a clock;
a clock switching part configured to detect a transmission speed of the input signal based on a corrected control signal for adjusting the feedback resistance, which corrected control signal is obtained by correcting the control signal with the correction signal, to generate a standard clock that corresponds to a clock for an input signal with a maximum transmission speed of the differing transmission speeds, and switch a frequency of a clock for identifying the output signal of the amplifying part according to the transmission speed detection result; and
a data identifying/reproducing part configured to sample an output signal from the AGC part, using the clock output by the dividing part, and to identify and reproduce data based on the sampled signal.

2. A preamplifier circuit, comprising:
a preamplifier configured to control a bandwidth for amplifying an input signal by varying a feedback resistance according to a control signal and producing an output signal;
a control signal generating part configured to determine a band of an output signal of the preamplifier and generate the control signal based on the determined band; and
a correction signal generating part configured to generate a correction signal for the control signal based on the output signal of the preamplifier and a clock;
wherein the control signal is corrected by the correction signal and the feedback resistance is adjusted by the corrected control signal
wherein the control signal generating part includes:
a first comparator configured to compare the output signal of the preamplifier with a first standard voltage;
a second comparator configured to compare the output signal of the preamplifier with a second standard voltage that is lower than the first standard voltage;
an exclusive OR circuit configured to calculate an exclusive OR from an output of the first comparator and an output of the second comparator and obtain an exclusive OR signal corresponding to a rise and fall detection signal of the output signal of the preamplifier;

an average value detection circuit configured to detect an average value of the exclusive OR signal; and a differential amplification circuit configured to conduct differential amplification on the average value and the correction signal.

3. The preamplifier circuit as claimed in claim 2, wherein the correction signal generating part includes:

a flip flop configured to sample the exclusive OR signal using a clock; and an integration circuit configured to integrate an output signal of the flip flop and generate an integrated value as the correction signal.

4. The preamplifier as claimed in claim 3, wherein the clock corresponds to a data identification clock for realizing data identification.

5. A clock switching circuit, comprising:

an amplifying part configured to control a bandwidth for amplifying an input signal by varying a feedback resistance according to a control signal, the input signal corresponding to one of a plurality of input signals with differing transmission speeds and producing an output signal;

a control signal generating part configured to determine a band of the output signal of the amplifying part and generate the control signal based on the determined band;

a correction signal generating part configured to generate a correction signal for the control signal based on the output signal of the preamplifier and a clock; and a clock switching part configured to detect a transmission speed of the input signal based on a corrected control signal for adjusting the feedback resistance, which corrected control signal is obtained by correcting the control signal with the correction signal, to generate a standard clock that corresponds to a clock for an input signal with a maximum transmission speed of the differing transmission speeds, and to switch a frequency of a clock for identifying the output signal of the amplifying part according to the transmission speed detection result.

6. The clock switching circuit as claimed in claim 5, wherein the clock switching part includes:

a transmission speed detection part configured to detect the transmission speed of the input signal by comparing the corrected control signal for adjusting the feedback resistance with a predetermined threshold value;

a clock generating part configured to generate the standard clock in synch with the input signal;

a dividing part configured to divide a frequency of the standard clock by a division ratio that is determined according to the transmission speed detection result, and to switch the frequency of the clock for identifying the output signal of the amplifying part according to the divided frequency.

7. The clock switching circuit as claimed in claim 6, wherein the control signal generating part includes:

a first comparator configured to compare the output signal of the amplifying part with a first standard voltage;

a second comparator configured to compare the output signal of the amplifying part with a second standard voltage that is lower than the first standard voltage;

an exclusive OR circuit configured to obtain an exclusive OR from an output of the first comparator and an output of the second comparator, and to generate an exclusive OR signal corresponding to a rise and fall detection signal of the output signal of the amplifying part;

an average value detection circuit configured to determine an average value of the exclusive OR signal; and a differential amplification circuit configured to conduct differential amplification on the average value and the correction signal.

8. The clock switching circuit as claimed in claim 7, wherein the correction signal generating part includes:

a flip flop configured to sample the exclusive OR signal using the standard clock; and an integration circuit configured to integrate an output signal of the flip flop and generate an integrated value as the correction signal.

9. The clock switching circuit as claimed in claim 8, wherein the amplifying part includes:

a preamplifier that varies the feedback resistance according to the control signal; and an AGC part configured to control a level of an output signal of the preamplifier to a fixed level and to output the level-controlled signal.

* * * * *